United States Patent [19]

Tambe et al.

[11] Patent Number: 4,999,573

[45] Date of Patent: Mar. 12, 1991

[54] METHOD AND APPARATUS FOR MEASUREMENT GATE DISPLAY

[75] Inventors: Atul Tambe, San Jose; Michael Wilson, Saratoga, both of Calif.

[73] Assignee: Hewlett-Packard Company, Palo Alto, Calif.

[21] Appl. No.: 388,787

[22] Filed: Jul. 31, 1989

[51] Int. Cl.$^5$ .................. G01R 13/20; G01R 23/16
[52] U.S. Cl. .............................. 324/121 R; 324/102; 315/377
[58] Field of Search ............... 324/121 R, 102, 77 A; 364/487, 481; 340/722; 315/377, 367

[56] References Cited

U.S. PATENT DOCUMENTS

| | | | |
|---|---|---|---|
| 2,591,738 | 4/1952 | Spencer | 324/102 |
| 3,359,491 | 12/1967 | McCutcheon | 324/121 R |
| 3,984,862 | 10/1976 | Volz | 324/121 R |
| 4,555,765 | 11/1985 | Crooke et al. | 324/121 R |

Primary Examiner—Reinhard J. Eisenzopf
Assistant Examiner—Vinh P. Nguyen

[57] ABSTRACT

A visual indication of the location and duration of a measurement gate relative to the signal being measured is provided on a display. In response to a start gate signal measurements are initiated and a predetermined change is effected in the normally displayed visual indication of the signal being measured. In response to a gate close indication, measurements are terminated and the normally displayed visual indication is resumed. The normal and changed visual indications are effected by a display control signal produced by summing the signal to be measured and an event gate signal at a point in the circuit near where the event gate signal is generated.

9 Claims, 2 Drawing Sheets 4,999,573

METHOD AND APPARATUS FOR MEASUREMENT GATE DISPLAY

FIELD OF THE INVENTION

This invention relates to devices which utilize a measurement gate to control the time interval during which measurements are taken on an electrical signal and more particularly to a method and circuit for providing a visual indication of the location and duration of such measurement gate relative to the signal being measured.

BACKGROUND OF THE INVENTION

There are many applications where measurements are being taken on a particular signal during a predetermined time interval, the time interval being controlled by a measurement gate signal. For example, in a system for measuring the frequency and other characteristics of a pulsed or continuous wave microwave signal, a measurement gate may be utilized to assure that measurements are taken within the pulsed microwave signal and that the measurement gate is sufficiently spaced from the beginning and end of the microwave pulse so that turn-on and turn-off transients will not corrupt the measurement. Where there is a change in frequency during a microwave signal or pulse, such as for a radar chirp, it is also important to know where in the signal readings are being taken so that a frequency profile of the signal can be generated.

However, because of variations in internal delays in the system, such as in counters or pulse generators, or in the cabling used with the system, it is possible that the measurement gate may fall outside of the microwave pulse being measured resulting in inaccurate readings. Such potential errors are of concern to the user, but are currently difficult to identify. Similarly, current systems do not afford the user an easy way of verifying where in a chirped or frequency varying signal a particular set of measurements are being taken, or in other words where the measurement gate is positioned relative to the signal being measured.

The above problems exist both where (a) the measurement gate is of fixed duration and measurement is effected by counting the number of cycles or events during the fixed time interval; and (b) a fixed number of event or cycles for the signal being measured determines the gate width and the duration of the gate is determined to measure frequency. The later method will sometimes be referred to as the reciprocal counting technique. The problems also exist both where the measurement gate is being automatically generated, for example in response to predetermined signal conditions, and where the gate is being generated in response to an external user-controlled input. The user-controlled input provides greater flexibility in determining both the location and duration of the measurement gate. However, absent some visual feedback as to where the measurement gate is occurring relative to the signal being measured, and in view of the variable delays and synchronizations which can occur in such measurement systems which make it difficult to maintain controls accurately calibrated, it is extremely difficult for a user to achieve precision manual positioning of a measurement gate.

In view of the above, a need exists for apparatus affording a user an accurate visual indication of the position of a measurement gate relative to the signal being measured so that a user may verify that the measurement gate is properly positioned relative to the signal to be measured and make adjustments if necessary.

SUMMARY OF THE INVENTION

In accordance with the above, this invention provides a method and circuit which give an accurate visual indication of the location and duration of a measurement gate relative to the signal being measured. The circuit has a means for generating a gate start signal and a means which normally provides a visual indication of the signal being measured. In response to the gate start signal, measurements are initiated and a predetermined change is effected in the visual indication. A means is also provided for generating a gate close indication and means are provided which are responsive to the gate close indication for terminating measurements and for permitting the normal visual indication to resume. Thus, the location and duration of the measurement gate relative to the signal being measured is indicated by the change which occurs in the display of the indication for the measured signal during the measurement gate. For the preferred embodiment, the signals being measured are microwave signals which are down converted to IF signals for measurement. The IF signals are displayed as a sequence of pulses on for example an oscilloscope screen. By summing the IF signals with a gate level signal occurring during the measurement gate, the summing preferably occurring near where the gate is generated, and utilizing the summed output to control the oscilloscope video, the desired display can be achieved.

The foregoing and other objects, features and advantages of the invention will be apparent from the following more particular description of a preferred embodiment of the invention as illustrated in the accompanying drawings.

IN THE DRAWINGS

DETAILED DESCRIPTION

Figure 1:
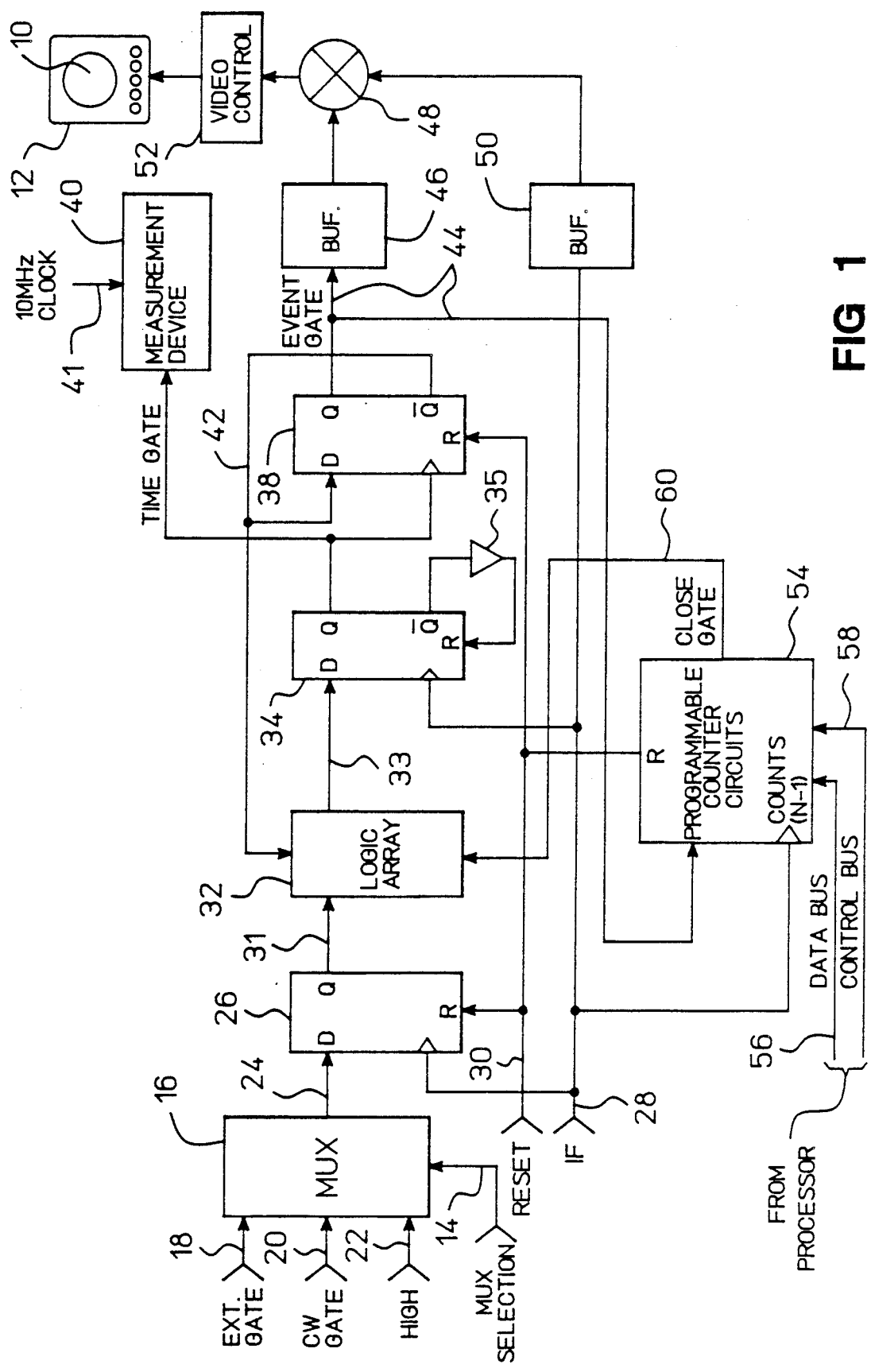
FIG. 1 is a schematic block diagram of a preferred embodiment of the invention.

FIG. 1 shows a circuit, in accordance with the teachings of this invention, for generating measurement gate signals for use with an IF signal being measured and for the display of the measurement gate with the IF signal on the screen 10 of an oscilloscope 12. More particularly, the circuit utilizes the IF signal to synchronize the generation of the gate to control measurement and a signal to control the display of the gate, the measurement gate and the display control signal being generated near each other in the circuit so that differential delays introduced by the circuit are minimized.

The circuit may operate in three different modes—an external gate mode, an automatic gate for continuous wave mode, and an automatic gate for pulse mode. The mode of operation for a given measurement is determined by a signal on MUX selection line 14, this line controlling multiplexer 16. The state of the signal on line or lines 14 is determined by an external control which may be manually operated, processor operated, or both. The inputs to multiplexer 16 are an external gate signal on line 18 which again may be provided by an external instrument controlled by user inputs and/or external processor controls. A second input to multiplexer 16 is an automatically generated continuous wave gate on line 20. The final input to multiplexer 16 is a continuous logic high voltage level on line 22 which is utilized in a manner to be described later to automatically generate the measurement gate for the pulsed wave input.

The signal on line 14 determines which of the lines 18–22 is connected through multiplexer 16 to multiplexer output line 24 which is connected to the D input of flip-flop 26. Flip flop 26 is clocked by pulses on intermediate frequency (IF) input line 28 and is reset by a signal on reset line 30. Flip-flop 26 will also reset if a clocked input is applied over line 28 when there is no signal level on line 24 (i.e., when multiplexer 16 is not generating an output). In the discussion to follow, it will be assumed that when a component is generating an output on a line, or there is otherwise a signal on a line, the line is at a logic high voltage or level, and when a component is not generating an output on a line or there is otherwise no signal on a line, the line is at a logic low voltage or level.

The reset signal on line 30 is a control which is generated by an external processor or may, under certain circumstances, be automatically generated in response to user inputs.

For the preferred embodiment, the IF signal is a down converted version of a microwave signal being measured, the conversion being necessary in some applications to permit the measurements to be made by state of the art counters. The microwave RF signal might, for example, be at a frequency in the 500 $MH_z$ to 20.5 $GH_z$ range, while the IF signal may be in the 45 $MH_z$ to 95 $MH_z$ range. The IF signal on line 28 is thus indicative of the microwave signal being measured.

The Q output from flip-flop 26 on line 31 is applied as one input to logic array 32. Logic array 32 may, for example, be a standard programmable logic array. The function of logic array 32 and the remaining inputs to this array will be described shortly. The output from logic array 32 on line 33 is applied to the D input of flip-flop 34. IF line 28 is connected as the clock input to this flip-flop and the input from the $\overline{Q}$ output of this flip-flop is connected through inverter 35 to its reset input.

Q output line 36 from flip-flop 34 is referred to as the "Time Gate" line and is connected both as the clock input to flip-flop 38 and as the Time Gate input to measurement device 40. The exact nature of measurement device 40 does not form part of this invention and standard measurement devices, such as event counters, time counters and the like, may be utilized for performing this function. For the preferred embodiment, it will be assumed that measurement device 40 contains time counters which, when enabled by a Time Gate, perform a time interval count in response to a 10 $MH_z$ clock signal on line 41. The $\overline{Q}$ output from flip flop 38 is connected as the D input to this flip flop and is also connected as an additional input to logic array 32. The reset input to this flip-flop is obtained from reset line 30.

The Q output from flip-flop 38 on line 44 is referred to as the "Event Gate" and is applied through an isolation buffer 46 as one input to summing circuit 48. IF line 28 is connected through an isolation buffer 50 as the other input to summing circuit 48. The output from summing circuit 48, which is a combination of the IF signal and the Event Gate, is applied to control video control circuit 52, which in turn controls the video display on screen 10 of oscilloscope 12.

The Event Gate signal on line 44 is also applied as one input to programmable counter circuits 54. The signal on line 44 is an enable input to these circuits. The clock or count inputs to the circuits is obtained from IF line 28 and the reset input to these circuits is obtained from reset line 30. The counter circuits are set in response to inputs from an external processor on data bus 56 and the processor may apply control inputs to the programmable counter circuits over control bus 58. Counter circuits 54, when enabled, count IF pulses or events on IF line 28. When this count reaches a predetermined value, for example (N − 1), where N is the number of IF pulses for a desired gate width, the counter circuits 54 generate an output on gate close line 60, line 60 being connected as the final input to logic array 32.

Logic array 32 is programmed to generate an output under one of three circumstances:

(1) when a signal is present on line 31, and a signal is present line 42 (indicating that gate is not open) and no signal is present on line 60 (indicating no close command from circuit 54);

(2) when a signal is present on line 31, a signal is present on line 60, and a signal is not present on line 42 (indicating that gate is open); and (3) when all three inputs to the logic array are at a logic low level (i.e., when there are no signals on line 31, line 42 and line 60).

In operation, a reset signal is initially applied to line 30 to reset the various flip-flop and counters. Reset signals would normally be applied to line 30 between measurements.

Figure 2:
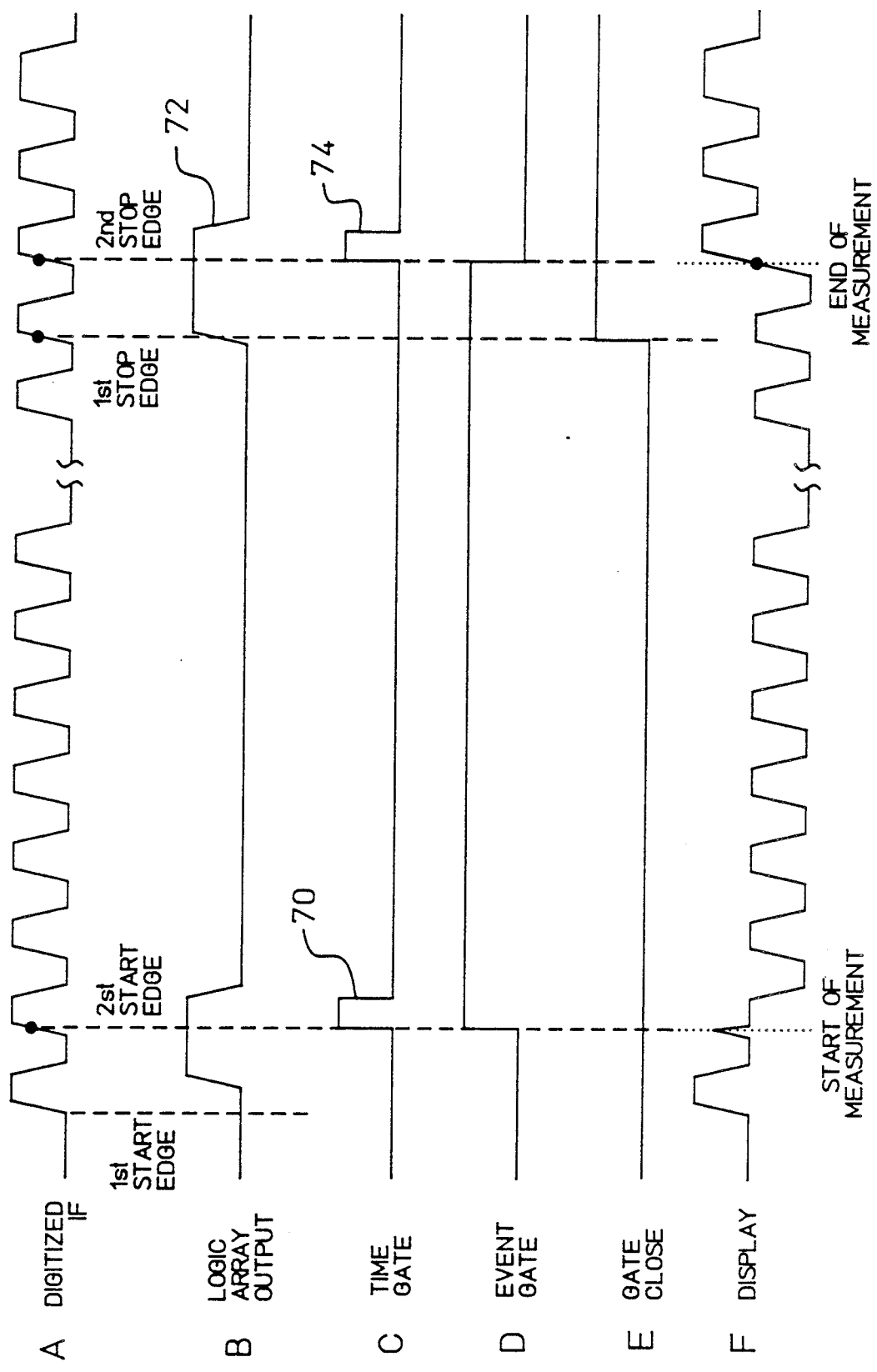
FIG. 2 is a diagram illustrating the signals appearing at various points in the circuit of FIG. 1.

Assume initially that a microwave pulse burst is being received, resulting in an IF pulse burst on line 28 such as that shown on line A of FIG. 2. This pulse burst will be assumed to have more than N pulses, where N is the number of pulses for the measurement gate. Assume further that the input on line 14 causes multiplexer 16 to select line 22 resulting in a continuous logic high output on line 24 to the D input of flip-flop 26. However, nothing happens with flip-flop 26 until an IF pulse is received on line 28, clocking flip-flop 26 to switch, and resulting in an output on Q output line 31 which is applied as an input to logic array 32. Since there is a logic high input on line 42 and a logic low input on line 60 to the logic array at this point, the logic array, in accordance with condition (1) described above, generates an output on line 33 as shown in line B of FIG. 2. This output is applied to the D input of flip flop 34 and, at the next IF pulse, flip-flop 34 switches, resulting in a logic high output on its Q output line 36. Flip-flop 34 switching to generate an output on its Q output line results in there being no output (logic low) on its $\overline{Q}$ line, causing inverter 35 to generate a signal which resets flip-flop 34. Thus, only a short Time Gate pulse appears at this time which is illustrated by the pulse 70 on line C of FIG. 2. The pulse 70 is applied to enable measuring device 40 to start counting 10 $MH_z$ clock pulses or to perform other measurement functions. The pulse 70 is also applied as a clock input to flip-flop 38. Since flip-flop 38 is in its reset condition at this time there is a signal logic high on line 42 which, when the flip-flop is clocked by the signal on line 36, causes flip-flop 38 to switch, resulting in an Event Gate output on line 44.

As previously indicated, the Event Gate signal, which is shown on line D of FIG. 2, is applied through an isolation buffer 46 to summing circuit 48. The IF signal on line 28 is applied through isolation buffer 50 as the other input to the summing circuit, resulting in an output from the summing circuit to video control circuit 52 which is a combination of the two signals. So long as there is no Event Gate signal on line 44, the only input to control video circuit 52 is the IF signal and this would result in a display on screen 10 which is similar to the waveform shown on line A of FIG. 2. The first pulse on line E of FIG. 2 is in this form. However, once the Event Gate signal appears on line 44, a combined input is applied to video control 52 which results in a DC shift in the input to the video control, and thus in a DC shift in the display. This shift is illustrated by the signal appearing on line F of FIG. 2. The shift in the displayed signal enables the user to easily view the cycle of the IF signal at which the measurement gate begins and ends and the portion of the IF signal being measured by the measurement gate. The display shows a slight delay between the beginning of the second IF pulse where the measurement interval is to begin and the time at which the measurement gate actually commences. This delay results from delays in the operation of circuit components such as flip-flops 34 and 38 and from any mismatches in buffers 46 and 50. However, the user is concerned only with the IF cycle at which measurement begins and this slight delay may therefore be ignored.

The Event Gate signal on line 44 is also applied as an input to programmable counter circuits 54, enabling these circuits to start counting IF events or pulses appearing on line 28. When this count reaches a predetermined programmable value, for example N − 1 where N is the number of IF pulses for a desired gate width, the programmable counter will generate an output (logic high) on close gate line 60. This output is shown on line E of FIG. 2. This output signal fulfills condition (2) above for enabling the logic array, causing logic array 32 to generate a second output pulse, which is illustrated as the output pulse 72 on line B of FIG. 2.

When the next IF pulse appears on line 34, this causes flip-flop 34 to switch, resulting in a Time Gate output pulse on line 36 which is illustrated by the pulse 74 on line C of FIG. 2. The pulse on line 34 is applied to measurement device 40 to cause this device to terminate the measurement cycle, or in other words to close the measurement gate. Pulse 74 is also applied to clock flip-flop 38. Since the Q output of this flip-flop is in its logic high state, $\overline{Q}$ output line 42 is in a logic low state, resulting in the flip flop being reset. This terminates the Event Gate signal on line 44, resulting in there again being only a single input to summing circuit 48. Therefore, there is no longer a DC offset in the signal applied to video control 52 and the display returns to its normal state, as illustrated for the last three pulses on line F of FIG. 2.

If multiplexer 14 is set for CW gate line 20, the system will generate a signal level on line 20 beginning at a particular time and ending at a particular time, the signal on line 20 corresponding to the time during which the measurement gate is to occur. Under these circumstances, the signal on line A of FIG. 2 would be continuous rather than terminating after a predetermined number of IF pulses occur.

When a logic high level appears on line 20, multiplexer 16 applies a logic high level through line 24 to the D input of flip flop 26. When the next IF pulse occurs, this flip-flop switches to generate a logic high signal on a Q output on line 31 which is operative in the manner previously described to cause an output on line 33 from logic array 32 The next IF pulse then results in flip-flop 34 switching to its Q state to generate the Time Gate pulse 70 on line 36 which enables measuring device 40 and clocks flip-flop 38 to switch to its Q state resulting in the Event Gate signal on line 44. Thus, to this point, the circuit operates in substantially the same way as it operated when in the pulse mode with line 22 enabled.

However, in this mode of operation, there are two possible ways in which the Time Gate and Event Gate may be terminated. The first way is the way previously described wherein the length of the measurement gate is desired to be N pulse of the IF signal. In this case, the duration of the signal on line 20 is longer than the maximum duration for any N pulses to be used for measurement and programmable counter circuits 54 are set to automatically generate a close gate signal on line 60 after a predetermined number (N − 1) of IF pulses have appeared on line 28. The gate close operation in this case is as previously described.

However, particularly for a chirped or other frequency varying signal, this may not be the preferred mode of operation. Thus, it is also possible to have a measurement gate of fixed duration determined by the CW gate signal on line 20, with counters 54 being used to count events during this time interval. For this mode of operation output, 60 of the counter circuits 54 is disabled by, for example, a control signal appearing on control bus 58. This causes the counter circuits to count IF signals for the duration of the gate. The measurement gate continues until the CW gate signal on line 20 terminates. When this occurs, the signal on line 24 goes to a logic low level, resulting in the resetting of flip-flop 26 on the occurrence of the next IF pulse on line 28. As previously indicated when the Q output line 31 from flip-flop 26 is low, resulting in all inputs to the logic array being in a logic low state, logic array 32, in accordance with condition (3) above, generates an output on line 33 which, on the occurrence of the next IF pulse on line 28, results in flip-flop 34 being switched to its Q state to generate the Time Gate pulse 74. As previously indicated, this gate pulse disables time measurement device 40 and results in the resetting of flip-flop 38 to terminate the Event Gate on line 44. The termination of the Event Gate disables counters 54 so that the count therein is the desired event count for the selected time interval.

Finally, when multiplexer 16 is set to select external gate line 18, the circuit is controlled by a signal level appearing on this line. As for the CW gate signal on line 20, when the signal on line 18 starts, this level is clocked through the circuit by IF pulses on line 28, resulting in the Time Gate signal 70 and in the commencement of the Event Gate on line 44. Similarly, when the external gate level on line 18 goes low, this causes line 31 to go low, causing logic array 32 to generate an output on line 33 which results in the Time Gate pulse 74 and causes the termination of the Event Gate, and thus terminates event counting by counter circuits 54.

A circuit and method are thus provided which generate the desired measurement clock signals for measuring a selected electrical signal and which provide a clear visual indication of the relative location and duration of the measurement clock and the signal being measured. This permits easy viewing of where the measurement gate is occurring for pulse signals and for chirped or frequency varying signals so that adjustments can be made if the measurement gate is not properly positioned. Differential delays between the measurement gate as used and as displayed are substantially eliminated by summing the signal controlling the display and the IF signal being measured at a point in the circuit near where the gate is generated and used.

While for the preferred embodiment, IF pulses have been utilized for clocking and for the display, it is apparent that the invention could be practiced using the RF pulses of the microwave signal, and that, with suitable modification, analog signals might be usable on line 28. The invention could also be practiced using the envelope of the RF pulse burst. It is also apparent that while the screen 10 of an oscilloscope 12 has been utilized for viewing the combined Event Gate and signal being measured, other suitable display devices, such as a CRT monitor or various types of printers, might also be utilized to provide the desired visual indication. Further, while specific hardware components are shown in FIG. 1 for implementing the invention, such components are not a limitation on the invention, and the invention may be practiced utilizing other suitable hardware, a programmed processor or a combination of hardware and software.

Thus, while the invention has been particularly shown and described above with respect to a preferred embodiment, the foregoing and other changes in form and detail may be made therein by one skilled in the art without departing from the spirit and scope of the invention.

What is claimed is:

1. A circuit for providing a visual indication of the location and duration of a measurement gate relative to the cycles of a multicycle signal being measured comprising:
    means for generating a first time gate signal at the start of a measurement gate and a second time gate signal at the close of the measurement gate, the first time gate signal and the second time gate signal being synchronized with separate cycles of the signal being measured;
    means responsive to said first time gate signal and to said second time gate signal for initiating a measurement at said first time gate signal; and for terminating a measurement at said second time gate signal; and
    means responsive to said first time gate signal, to said second time gate signal for generating an event gate signal beginning with the first time gate signal and ending with the second time gate signal;
    means for summing the signal being measured with said event gate signal to produce a display signal, said summing means located close to the point in the circuit where said event gate is generated, whereby differential delays in said circuit between the signal being measured and the event gate signal are minimized; and
    means for utilizing the display signal to provide a visual indication of the signal being measured having an altered visual indication for the cycles of the signal being measured occurring during the duration of the measurement gate.

2. A circuit as claimed in claim 1 wherein said display means further comprises an oscilloscope having a video screen, said visual indication being provided on said video screen.

3. A circuit as claimed in claim 1
    wherein the signal being measured is an IF signal resulting from down converting a pulsed microwave signal for measurement.

4. A circuit as claimed in claim 3 wherein said means for generating the first time gate signal includes means for generating said first time signal a predetermined number of cycles of the signal being measured after the start of a pulse burst in the signal being measured.

5. A circuit as claimed in claim 1 wherein the signal being measured is a pulsed signal; and
    wherein said means for generating the first time gate signal is responsive to the signal being measured and includes means for generating said first time gate signal a predetermined number of cycles of the signal being measured after the start of a pulse burst in the signal being measured.

6. A circuit as claimed in claim 1 wherein said means for generating the first time gate signal includes means responsive to an externally applied gate signal and to the signal being measured for controlling the generation of said first time gate signal.

7. A circuit as claimed in claim 1 wherein said means for generating the second time gate signal includes means responsive to an externally applied gate signal for controlling the generation of said second time gate signal.

8. A circuit as claimed in claim 1 wherein the signal being measured is a pulsed signal; and
    wherein said means for generating the second time gate signal is responsive to the signal being measured and includes means for generating said second time gate signal a predetermined number of cycles of the signal being measured after the first time gate signal.

9. A method for providing a visual indication of the location and duration of a measurement gate relative to the cycles of a signal being measured comprising the steps of:
    generating a first time gate signal, synchronized with the cycles of the signal being measured, at the start of a measurement gate, for starting a measurement;
    initiating a measurement in response to said first time gate signal;
    generating a second time gate signal, synchronized with the cycles of the signal being measured, at the close of the measurement gate, for terminating the measurement;
    terminating the measurement in response to said second time gate signal; and
    generating an event gate signal in response to said first time gate signal and said second time gate signal beginning with the first time gate signal and ending with the second time gate signal;
    summing said event gate signal with said signal being measured to produce a display signal, said summing performed near where said event gate is generated, whereby differential delays between the signal being measured and the event gate signal are minimized;
    utilizing said display signal to provide a visual indication of the signal being measured having an altered visual indication for the cycles of the signal being measured occurring during the measurement gate.

* * * * *